United States Patent [19]
Watanabe et al.

[11] Patent Number: 4,624,896
[45] Date of Patent: Nov. 25, 1986

[54] MULTI-LAYER CERAMIC SUBSTRATE AND METHOD FOR THE PRODUCTION THEREOF

[75] Inventors: Yutaka Watanabe, Hadano; Fumiyuki Kobayashi, Sagamihara; Satoru Ogihara, Hitachi; Yoshiyuki Ohzawa, Hiratsuka, all of Japan

[73] Assignee: Hitachi, Ltd., Tokyo, Japan

[21] Appl. No.: 627,889

[22] Filed: Jul. 5, 1984

[30] Foreign Application Priority Data

Jul. 4, 1983 [JP] Japan .................................. 58-120359

[51] Int. Cl.⁴ ............................................... B32B 3/10
[52] U.S. Cl. ..................................... 428/428; 156/89; 428/432; 428/469; 428/472; 428/209; 428/210; 428/901; 428/698
[58] Field of Search ................... 156/89; 428/698, 699, 428/472, 469, 428, 432, 901, 701, 209, 210

[56] References Cited

U.S. PATENT DOCUMENTS 3,908,184  9/1975  Anazawa et al. ..................... 357/72
3,965,567  6/1976  Beerwerth et al. ................ 357/71 X
4,032,350  6/1977  Greenstein ...................... 106/171 X
4,094,704  6/1978  Milnes ............................... 357/59 X
4,137,355  1/1979  Heaps et al. .................... 428/446 X
4,161,746  7/1979  Johnson et al. .................... 357/72 X
4,299,873  11/1981 Ogihara et al. ................. 428/901 X
4,387,131  6/1983  Anderson et al. ............... 428/901 X
4,460,916  7/1984  Hashimoto et al. ............. 428/701 X
4,465,727  8/1984  Fujita et al. .................... 428/701 X Primary Examiner—Nancy A. B. Swisher
Attorney, Agent, or Firm—Antonelli, Terry & Wands

[57] ABSTRACT

The multi-layer ceramic substrate of this invention includes conductor layers and insulating layers disposed between the conductor layers. The insulating layers include the layers of a sintered body principally composed of mullite and the layers of a sintered body principally composed of alumina. This multi-layer ceramic substrate is produced by laminating the green sheets and sintering the laminate. The green sheets principally composed of mullite and the green sheet principally composed of alumina are prepared, and they are laminated and sintered.

6 Claims, 4 Drawing Figures

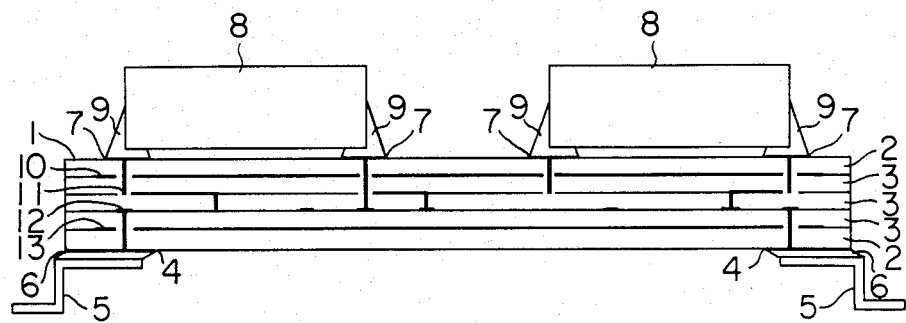
F I G. 1
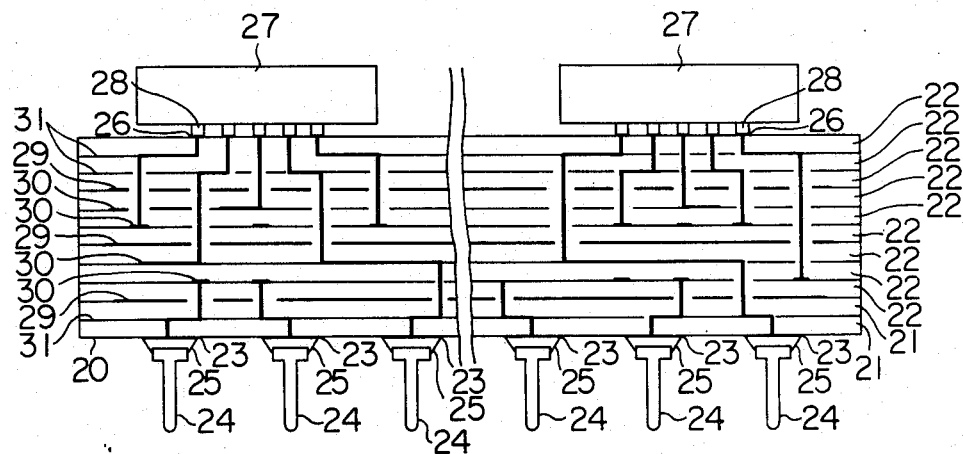
F I G. 2

MULTI-LAYER CERAMIC SUBSTRATE AND METHOD FOR THE PRODUCTION THEREOF

BACKGROUND OF THE INVENTION

1. Field of the Invention

This invention relates to a multi-layer ceramic substrate and a method for producing such substrate. More particularly, the invention pertains to a multi-layer ceramic substrate suited for constituting a function module by mounting semiconductor parts and joining pins for signal input and output thereto, and a method for producing such a substrate.

2. Description of the Prior Art

Recently, ceramic substrates incorporating signal lines in multiple layers are used popularly as the substrate for mounting semiconductor parts in a high-density arrangement. The ceramic insulators used for such substrates are mostly made of a sintered body principally composed of alumina ($Al_2O_3$). A typical example of such ceramic insulators is discussed in a paper "A Multi-Layer Ceramic, Multi-Chip Module" (IEEE, 30th Electronic Component Conference, 1980, pp 283-285). The greatest disadvantage of the substrate using such an alumina-based sintered body as an insulator is the large signal propagation delay. Generally, the signal propagation delay is proportional to the square root of the dielectric constant of the insulator surrounding the signal lines, and the dielectric constant of alumina is as large as about 10, so that the sintered body which is mainly composed of alumina also has a large dielectric constant which is on the order of 9.0 to 10.0. Such a large dielectric constant of the sintered body leads to a large signal propagation delay of the substrate.

For solving the problem of large signal propagation delay, studies have been made on the substrates using an insulator with a small dielectric constant. An example of such substrates developed recently is disclosed in Japanese Patent Laid-Open Publication No. 57-115895 "Mullite sintered body and method for the production thereof". This patent shows that the use of a sintered body mainly composed of mullite ($3Al_2O_3.2SiO_2$) as an insulator can give a ceramic substrate with a dielectric constant as low as 5.4 to 5.9.

Inspite of such advantages of mullite, alumina is still dominantly used in the field of multi-layer ceramic substrates. This is due to the fact that it is impossible with mullite to obtain as high thermal and mechanical strength as provided by the use of alumina, and that the substrates using mullite tend to suffer from crack, wear-off of the metallized surface coating and other trouble originating in the stress built up by the heat generated in the step of soldering pins and other parts to the substrate, making it difficult to obtain the products of high reliability in a commercial yield.

SUMMARY OF THE INVENTION

An object of this invention is to provide a multi-layer ceramic substrate which is small in signal propagation delay and has high mechanical strength in the surface region.

Another object of this invention is to provide a method suited for producing such a substrate.

The multi-layer ceramic substrate according to this invention consists of a plurality of conductor layers and insulating layers disposed between said conductor layers and characterized in that said insulating layers comprise layers of a sintered body mainly composed of mullite and layers of a sintered body mainly composed of alumina.

The ceramic substrate having these insulating layers consisting of the layers of sintered bodies with different principal component materials according to this invention can be best produced by forming the insulating layers into green sheets and then treating the green sheets, so that the ceramic substrate producing method of this invention is characterized by first preparing the first and second green sheets which are principally composed of mullite and alumina, respectively, then laminating these first and second green sheets, and sintering the laminate.

BRIEF DESCRIPTION OF THE DRAWINGS

FIG. 1 is a schematic illustration of an embodiment of this invention.

FIGS. 2 to 4 are the schematic illustrations of other embodiments of this invention.

DESCRIPTION OF THE PREFERRED EMBODIMENTS

Figure 3:
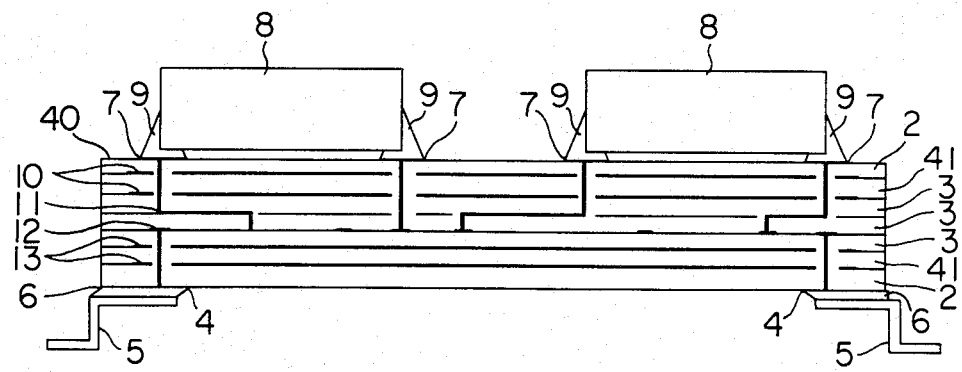

Before describing the embodiments of this invention in detail, a synoptic account of the invention and its embodiments will be given.

The present invention, as mentioned before, provides a multi-layer ceramic substrate consisting of a plural number of conductor layers and a corresponding number of insulating layers disposed between said conductor layers, characterized in that said insulating layers consist of layers of a sintered body principally composed of mullite (about half or more of the sintered body is composed of mullite) and layers of a sintered body principally composed of alumina (about half or more of the sintered body is composed of alumina). It is preferred in this invention that the insulating layers in the inside of the substrate where signal is transmitted are made of a sintered body principally composed of mullite which is small in dielectric constant whilst the insulating layer on the surface (on the rear side) where thermal stress is given when mounting parts such as pins are made of a sintered body principally composed of alumina which has high thermal and mechanical strength. In case a desired substrate can be obtained by only slightly improving the properties of both the sintered body principally composed of alumina and the sintered body principally composed of mullite, it is possible to mix a small quantity of mullite in the sintered body principally composed of alumina and to mix a small quantity of alumina in the sintered body principally composed of mullite.

There is a relatively wide difference in thermal expansion coefficient between the sintered body principally composed of mullite and the sintered body principally composed of alumina, so that cracks could be produced at their interface. Such problem can be almost completely solved by placing between the layers of said respective sintered bodies a layer of a sintered body principally composed of a mixture of alumina and mullite for buffering said difference in thermal expansion coefficient. This effect is maximized when said interposed layer is so constituted that about $\frac{2}{3}$ of the principal component of said mixed sintered body will be same as the principal component of the adjoining layer. For this purpose, the layer of the sintered body principally composed of a mixture of alumina and mullite may be constituted from at least two mutually adjoining layers and arranged such that one of the layers adjacent to the layer of the sintered body principally composed of mullite will have a greater alumina content than the mullite content while the other layer adjacent to the layer of the sintered body principally composed of alumina will have a greater mullite content than the alumina content.

According to the substrate production method of this invention, the respective insulating layers are formed into green sheets and such green sheets are laminated and sintered. It is especially recommended to use the green sheets containing a glass component of a substantially same composition as a flux because, in this case, the liquid phase sintering temperature can be kept uniform so that no strain is left in the product. Usually, in the mullite or alumina sintered body used for a multi-layer ceramic substrate, glass is contained as flux in an amount of 2 to 30% by weight. Therefore, when the glass particles existing between the mullite or alumina particles reach a temperature above the softening point of glass, such glass particles in the whole body are almost simultaneously softened and vitrified to surround the mullite or alumina particles to form a homogenous sintered body free of pore. Also, since so-called liquid phase sintering is conducted, it is possible to accomplish the desired sintering at a relatively low temperature, in the range of 1,400° to 1,600° C., and in a short time. As noted from this, the primary factor that manages the advancement of sintering is not the principal component material such as mullite or alumina but is glass used as flux, more definitely the softening point of glass. This means that even if both principal component materials, that is, mullite and alumina, stay mixed in parts, if a glass component of a same composition is used as a flux, the same liquid phase sintering is carried out and hence uniform sintering can be accomplished.

The best method for producing a combination of insulating layers with different principal component materials mullite and alumina is one in which the insulating material is once formed into a green sheet and the latter is properly worked, integrally laminated and then sintered. When forming the green sheet, there are used, beside said principal component materials (mullite and alumina) and said glass flux, a binder, a plasticizer and a solvent. Synthetic resins such as polyvinyl alcohol, polyvinyl butyral and methacrylic acid resin may be used as the binder. Dioctyl phthalate can be used as the plasticizer. Methanol, trichloroethylene, toluene and the like may be used as the solvent. These substances are properly weighed and mixed to form a slurry. Then this slurry is coated on a support such as a polyester film, the coating thickness being properly adjusted by a suitable means such as a doctor blade, and the coating is dried to obtain a green sheet. In this green sheet are formed through-holes for connecting the conductor circuits, and further a molybdenum or tungsten paste which is to constitute the conductor circuits is printed in said through-holes and on the sheet surface according to the desired circuit pattern. The thus worked plural number of green sheets, which are principally composed of mullite and alumina, respectively, are integrally laminated into a desired structure and then sintered in a neutral or reducing atmosphere. A reducing atmosphere is required for preventing the molybdenum or tungsten used for conductor circuits from being oxidized and volatilized away. However, it is desirable that water be contained as an oxidation source in said atmosphere for a time in the course of sintering for causing oxidation and decomposition of the binder and/or plasticizer contained in the green sheet. When sintering is carried out in a reducing atmosphere, use of glass powder containing an easily reduceable oxide such as lead oxide or titanium oxide may cause deterioration of the insulating properties of the sintered body, that is, the substrate. Therefore, it is recommended to use glass powder which is substantially free of such compounds. The thus produced multi-layer ceramic substrate is plated with a suitable metal such as nickel and then the pins made of a suitable material such as Kovar are brazed to the substrate with a solder such as silver solder. Then the semiconductor parts are properly mounted on the substrate to constitute a function module.

Now, the embodiments of this invention will be described in detail. In the following description of the Examples, all "parts" and "%" are by weight unless otherwise noted.

EXAMPLE 1

90 parts of mullite powder ($3Al_2O_3.2SiO_2$) passing 325-mesh screen and 10 parts of glass powder having a composition of $SiO_2:Al_2O_3:MgO=51.3:34.9:13.8$ (weight ratio) were fed into a ball mill and dry mixed for 3 hours. Further added to this mixture were 5.9 parts of polyvinyl butyral, 24 parts of dioctyl phthalate, 23 parts of trichloroethylene, 9 parts of perchloroethylene and 6 parts of butyl alcohol, followed by three-hour mixing to form a slurry. Air bubbles were removed from the slurry by vacuum degassing. Then this slurry was coated on a polyethylene film support to a thickness of 0.3 mm by using a doctor blade and dried by passing through an oven to prepare a green sheet having mullite as its principal constituent, hereinafter referred to as mullite green sheet.

By following the same process as said above except that 90 parts of said mullite powder was replaced with 90 parts of alumina powder ($Al_2O_3$) passing 325-mesh screen, there was prepared a green sheet having alumina as its main constituent, hereinafter referred to as alumina green sheet.

Each of these green sheets was cut to a size of 200×200 mm and punched to form through-holes at the predetermined positions. Then a conductor paste having a composition of molybdenum powder:nitrocellulose:ethyl cellulose:polyvinyl butyral:trichloroethylene=100:3:1:2:23 (weight ratio) was screen printed according to the predetermined circuit pattern. Through-holes were also filled with the conductor paste for the interlayer connection. FIG. 1 is a schematic illustration of the structure of the multi-layer ceramic substrate produced according to this Example. This multi-layer ceramic substrate 1, as seen from the illustration, consists of five insulating layers 2 and 3 and six conductor layers 4, 7 and 10-13. Alumina green sheet is used for the green sheets corresponding to the insulating layers 2 and mullite green sheet is used for the green sheets corresponding to the other insulating layers 3. These green sheets were placed in five layers with the guide holes registered with each other and laminated under pressure at a temperature of 90° C. Then this laminate of green sheets was placed in a sintering oven and sintered in a nitrogen atmosphere containing 3 to 7% by volume of hydrogen and a small quantity of water vapor by retaining the laminate in said atmosphere under heating to a maximum temperature of 1,600° C. for one hour.

In this way, there was produced a multi-layer ceramic substrate 1 consisting of five insulating layers and six conductor layers in which the two insulating layers 2 exposed on both surfaces were made of a sintered body principally composed of alumina and the other insulating layers 3 were made of a sintered body principally composed of mullite. This substrate had generally a good interlaminar adhesion. After electroless nickel plating of the conductor layer 4 on the rear side surface of the substrate, Kovar leads 5 were joined to said layer by silver braze by a usual method using carbon jigs. Also, chip carriers 8 made of a ceramic material principally composed of alumina were joined by braze 9 to the conductor layer 7 on the top surface of the substrate. The tensile strength of the leads was 1 kg/pin or above. This value is more than four times that of the substrate in which all the layers are made of a sintered body principally composed of mullite and almost equal to that of the substrate in which all the layers are made of a sintered body principally composed of alumina. Thus, this strength is high enough for the substrate to stand the practical use.

Also, as the chip carriers 8 and the insulating layer 2 on the top surface of the substrate were both principally composed of alumina and close to each other in thermal expansion coefficient, the braze joint 9 of each said chip carrier 8 suffered no break in more than 3,000 heating-/cooling cycles between $-65°$ C. and $+150°$ C. This endurance strength is more than double that of the substrate in which all the layers are made of a sintered body principally composed of mullite and almost equal to that of the substrate in which all the layers are made of a sintered body principally composed of alumina, and thus this strength guarantees a satisfactorily long joint life even under the severe use conditions.

The signal propagation delay time of the X wiring layer 11 and Y wiring layer 12 held between a power source layer 10 (a conductor layer) and a ground layer (an alternating type ground layer) was 7.7 ns/m. This value corresponds with the low dielectric constant (5.5) of the insulating layers 3. In the case of the substrate in which all the layers are made of a sintered body principally composed of alumina, the dielectric constant is about 9.5 and the signal propagation delay time is 10.2 ns/m, so that the substrate according to this Example of the invention is reduced 75% in signal propagation delay time over the above-mentioned substrate.

EXAMPLE 2

Mullite green sheets, each having a thickness of 0.25 mm, were prepared by following the same procedure as in Example 1 by using 70 parts of mullite powder and 30 parts of glass powder consisting of 55% of $SiO_2$, 30% of $Al_2O_3$, 9% of MgO and 6% of CaO, and a conductor paste prepared from 100 parts of tungsten powder, 3 parts of nitrocellulose, 1 part of ethyl cellulose, 2 parts of polyvinyl butyral and 23 parts of trichloroethylene was printed after the manner of Example 1.

There were also similarly prepared alumina green sheets by using 70 parts of alumina powder instead of mullite powder in otherwise the same way as mentioned above, and the conductor paste was similarly printed.

FIG. 2 shows schematically the structure of the multi-layer ceramic substrate 20 produced in this Example. In this Example, alumina green sheets were used for only two insulating layers 21 on the back side of the substrate, and mullite green sheets were used for all of other insulating layers 22. The total number of insulating layers was 11. This multi-layer ceramic substrate 20 is otherwise the same in structure as that of Example 1. The interlaminar adhesion in this substrate was generally good. The conductor layer 23 on the rear side of the substrate was electroplated with nickel and then Kovar pins 24 were joined to said layer by silver solder 25 in the usual way using carbon jigs. On the surface conductor layer 26 were mounted silicon semiconductor elements 27 which were joined facedown to the substrate directly by solder 28. The pin tensile strength was above 4 kg/pin which is the value shown by the substrate in which all the layers are made of a sintered body principally composed of alumina, which indicates that the substrate of this Example has enough strength to well stand the practical use. Also, the solder joint 28 of each silicon semiconductor element 27 stayed safe from break in more than 2,000 heating/cooling cycles with temperatures between $-65°$ C. and $+150°$ C. This durability is about twice that of the substrate having its all layers made of a sintered body principally composed of alumina and about equal to that of the substrate where mullite is used as the principal component of the sintered body. This ensures the satisfactory joint life even under the harsh use conditions. Such high strength can be attributed to the fact that since the thermal expansion coefficient of the sintered body mainly composed of mullite is on the order of $38-45 \times 10^{-7}$/°C. which is close to that of silicon semiconductors, the substrate when heated becomes equal in elongation to silicon semiconductors and hence no stress is exerted to the solder joint 28. In the case of alumina substrate, said thermal expansion coefficient is $65-75 \times 10^{-7}$/°C. which is widely different from that of silicon semiconductors, so that in this case stress is given to the solder joint when the substrate is heated, causing early break of the joint. The signal propagation delay time of the wiring layers 30 held between a power source layer and an alternating type ground layer, or ground layer 29 was 8.0 ns/m. This value is relevant to the dielectric constant of 5.9 of the insulating layers 22. In the case of the substrate in which all the layers are made of a sintered body principally composed of alumina, the dielectric constant is about 9.5 and the signal propagation delay time is 10.2 ns/m, so that the substrate in this embodiment of the invention is reduced to 78% in signal propagation delay time over said alumina substrate. Electroconductive layers 31 are the conversion layers (also called expansion layers) for making the pitch of the pins 24 and solder joint 28 on the surface agree with the wiring lattice pitch in the inside of the substrate.

As understood from Examples 1 and 2, there can be obtained a multi-layer ceramic substrate having a high surface strength by disposing a sintered body principally composed of alumina in the rear side surface layer where pins are soldered and thermal and/or mechanical stress is exerted. In the surface layer on the side where the electronic parts are mounted, there is used a sintered body mainly composed of alumina or mullite having a thermal expansion coefficient close to that of the electronic parts, whereby it is possible to reduce the stress given to the joints with the electronic parts. Also, in the substrate of this invention, a sintered body principally composed of mullite having a small dielectric constant is used for the insulating layers positioned between the signal line layers and the alternating ground layers where the return current from said signal lines flows.

This enables a diminution of the signal propagation delay time.

EXAMPLE 3

Multi-layer ceramic substrates were produced by following the same procedure as in the foregoing Examples but by changing the glass composition and the mixing ratio of mullite or alumina and glass. The results of measurement of thermal expansion coefficient and dielectric constant of the sintered bodies used are shown in Tables 1 and 2. Table 1 shows the results obtained with the sintered bodies using mullite as principal constituent and Table 2 shows the results with the sintered bodies using alumina as principal constituent. In case multi-layer substrates are produced by combining said both types of sintered bodies, the substrate properties are substantially unchanged even if a difference of up to about ±10 parts is produced in the weight parts of mullite and alumina and in the weight part of glass powder, but it is necessary that the glass composition itself be substantially fixed. It is also desirable that the binder, plasticizer and solvent used in the preparation of green sheets are each substantially fixed in composition and amount.

TABLE 1

| No. | Mullite (parts) | Glass powder Composition (%) | | | | (parts) | Sintered body Thermal expansion coefficient ($\times 10^{-7}/°C.$) | Dielectric constant |
| --- | --- | --- | --- | --- | --- | --- | --- | --- |
| | | SiO$_2$ | Al$_2$O$_3$ | MgO | CaO | | | |
| 1 | 70 | 55 | 30 | 9 | 6 | 30 | 43 | 5.9 |
| 2 | 80 | " | " | " | " | 20 | 44 | 5.9 |
| 3 | 90 | " | " | " | " | 10 | 45 | 5.7 |
| 4 | 95 | " | " | " | " | 5 | 45 | 5.8 |
| 5 | 70 | 51 | 35 | 14 | — | 30 | 38 | 5.5 |
| 6 | 80 | " | " | " | — | 20 | 39 | 5.6 |
| 7 | 90 | " | " | " | — | 10 | 40 | 5.5 |
| 8 | 95 | " | " | " | — | 5 | 40 | 5.6 |
| 9 | 80 | 40 | 40 | 13 | 7 | 20 | 43 | 5.5 |
| 10 | 90 | " | " | " | " | 10 | 44 | 5.4 |
| 11 | 95 | " | " | " | " | 5 | 44 | 5.5 |
| 12 | 97 | " | " | " | " | 3 | 45 | 5.4 |

TABLE 2

| No. | Alumina (parts) | Glass powder Composition (%) | | | | (parts) | Sintered body Thermal expansion coefficient ($\times 10^{-7}/°C.$) | Dielectric constant |
| --- | --- | --- | --- | --- | --- | --- | --- | --- |
| | | SiO$_2$ | Al$_2$O$_3$ | MgO | CaO | | | |
| 1 | 70 | 55 | 30 | 9 | 6 | 30 | 68 | 9.5 |
| 2 | 80 | " | " | " | " | 20 | 70 | 9.6 |
| 3 | 90 | " | " | " | " | 10 | 73 | 9.6 |
| 4 | 95 | " | " | " | " | 5 | 75 | 9.7 |
| 5 | 70 | 51 | 35 | 14 | — | 30 | 65 | 9.4 |
| 6 | 80 | " | " | " | — | 20 | 67 | 9.4 |
| 7 | 90 | " | " | " | — | 10 | 70 | 9.5 |
| 8 | 95 | " | " | " | — | 5 | 72 | 9.6 |
| 9 | 80 | 40 | 40 | 13 | 7 | 20 | 68 | 9.4 |
| 10 | 90 | " | " | " | " | 10 | 72 | 9.5 |
| 11 | 95 | " | " | " | " | 5 | 74 | 9.6 |
| 12 | 97 | " | " | " | " | 3 | 75 | 9.8 |

As described above, by using in combination a sintered body principally composed of mullite and a sintered body principally composed of alumina, there can be obtained a multi-layer ceramic substrate with satisfactory signal propagation speed and surface strength. However, as mentioned before, such substrate still involves the possibility that cracks be produced at the interface of said both types of sintered bodies due to a relatively wide difference in thermal expansion coefficient between them. Especially, such cracks tend to be produced at the interface on the side of the substrate where the number of the laminate layers is small, for example, at the interface between the insulating layers 2 and 3 in the example of FIG. 1 and at the interface between the insulating layers 21 and 22 in the example of FIG. 2. The examples incorporating an improvement against such problem are shown below.

EXAMPLE 4

0.3 mm thick mullite green sheets were prepared after the manner of Example 1 by using 90 parts of mullite powder (3Al$_2$O$_3$.2SiO$_2$) and 10 parts of glass powder consisting of 51.3% of SiO$_2$, 34.9% of Al$_2$O$_3$ and 13.8% of MgO, and a conductor paste of the composition of molybedenum powder:nitrocellulose:ethyl cellulose:polyvinyl butyral:trichloroethylene=100:3:1:2:23 was screen printed.

Alumina green sheets were also similarly prepared by using 90 parts of alumina powder (Al$_2$O$_3$) instead of mullite powder, and the conductor paste was similarly printed.

Further, mullite and alumina mixed green sheets (0.3 mm thick each) were prepared in the same way as in the preparation of mullite green sheets and alumina green sheets in Example 1 by mixing 45 parts of mullite powder and 45 parts of alumina powder, both passing 325-mesh screen, with 10 parts of glass powder consisting of 51.3% of SiO$_2$, 34.9% of Al$_2$O$_3$ and 13.8% of MgO, and a conductor paste of the same composition as said above was screen printed.

FIG. 3 shows the structure of a multi-layer ceramic substrate produced in this Example. In FIG. 3 the same parts as those shown in FIG. 1 are affixed the same reference numerals. In this Example, alumina green sheet is used for the green sheets corresponding to the insulating layers 2 and mullite green sheet is used for the green sheets corresponding to the insulating layers 3, and also mullite/alumina mixed green sheet is used for the green sheets corresponding to the insulating layers 41 held between alumina green sheets and mullite green sheets. These green sheets were placed in seven layers and they were laminated under pressure at a temperature of 90° C. and sintered under the same conditions as in Example 1.

In this way, there was produced a multi-layer ceramic substrate 40 consisting of seven insulating layers and eight conductor layers in which two insulating layers 2 exposed on both surfaces were made of a sintered body principally composed of alumina, three inside insulating layers 3 were made of a sintered body principally composed of mullite and two insulating layers 41 held between said layers 2 and 3 were made of a sintered body principally composed of a mixture of alumina and mullite. Interlaminar bonding of this substrate was almost good. Then Kovar leads 5 and ceramic-made chip carriers 8 were joined after the manner of Example 1. The lead tensile strength and break resistance of solder joints 9 were the same as those of Example 1 and the measured values thereof were satisfactory ones. The signal propagation delay time was also same as in Example 1.

What should be specifically noted with the substrate of this Example is that this substrate, unlike the substrate of Example 1, was free of cracks at the interface of alumina and mullite sintered bodies. This can be accounted for as follows: the thermal expansion coefficient of the sintered body mainly composed of mullite (mullite sintered body) is $40 \times 10^{-7}/°C$. and that of the alumina sintered body is $70 \times 10^{-7}/°C$. while that of the mixed mullite/alumina sintered body is $55 \times 10^{-7}/°C$. which is a value intermediate between the first-mentioned two, and thus the difference in thermal expansion coefficient between alumina and mullite is buffered down by interposing the sintered body mainly composed of alumina/mullite mixture which shows said intermediate value.

EXAMPLE 5

Mullite green sheets and alumina green sheets were prepared under the same conditions as in Example 2, and a conductor paste was printed. There were also prepared mixed mullite/alumina green sheets by using 70 parts of a 70:30 mixture of mullite and alumina powders, with the glass powder, conductor paste and green sheet thickness being the same as those used in preparation of said mullite and alumina green sheets, and said conductor paste was printed. There were further prepared mullite/alumina green sheets by using 70 parts of a 30:70 mixture of mullite and alumina powder under otherwise the same conditions as used in preparation of the above-mentioned mixed green sheets and said conductor paste was printed.

Figure 4:
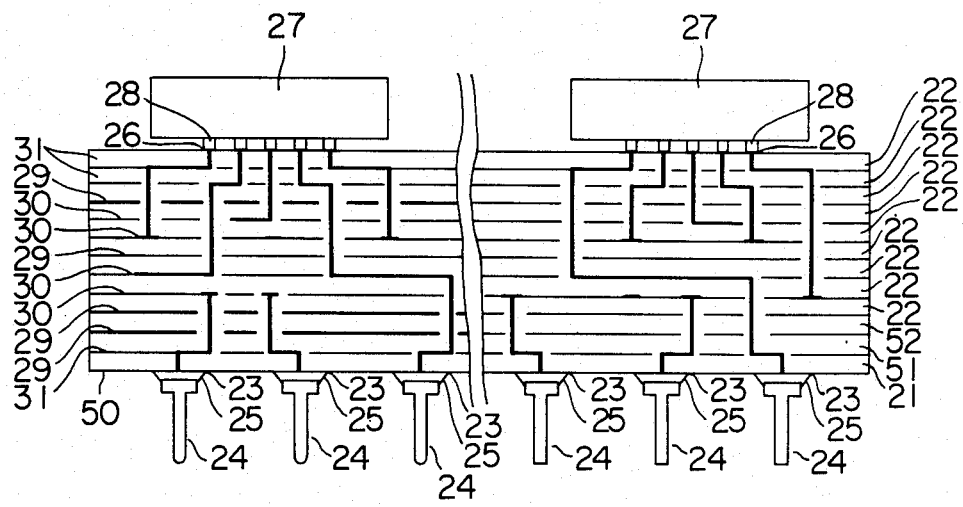

The structure of the multi-layer ceramic substrate 50 obtained in this Example is shown in FIG. 4 where the same parts as those shown in FIG. 2 are affixed the same reference numerals. In this example, mullite/alumina green sheets are used as the green sheets corresponding to the insulating layers 51 and 52 disposed between the alumina green sheet corresponding to the insulating layer 21 and the mullite green sheets corresponding to the insulating layers 22. It is to be noted that the mullite/alumina green sheet with greater alumina content than mullite content is used for the insulating layer 51 adjoining to the insulating layer 21 formed by an alumina green sheet and another mullite/alumina green sheet with greater mullite content than alumina content is used for the insulating layer 52 adjoining to the insulating layer 22 formed by a mullite green sheet. These green sheets were laminated in 12 layers and treated according to the same process as in Example 2 to make a multi-layer ceramic substrate 50, and then Kovar pins 24 and silicon semiconductor elements 27 were joined.

The thus produced substrate showed the same properties as the substrate of Example 2. Also, thanks to the stepwise differing thermal expansion coefficients of the insulating layers 21, 51, 52 and 22, no crack was produced at the interface. The thermal expansion coefficients of the respective insulating layers are as follows:

Insulating layer 21: $68 \times 10^{-7}/°C$.
Insulating layer 51: $61 \times 10^{-7}/°C$.
Insulating layer 52: $50 \times 10^{-7}/°C$.
Insulating layer 22: $43 \times 10^{-7}/°C$.

If an insulating layer made of a sintered body formed with a green sheet prepared by using 70 parts of a 50:50 mixture of mullite and alumina powders and the same glass powder as mentioned above is additionally placed between the insulating layers 51 and 52, since the thermal expansion coefficient of this interposed insulating layer is $56 \times 10^{-7}/°C$., there is provided an even more gentle gradient of difference of thermal expansion coefficient to produce a greater effect for the prevention of crack.

EXAMPLE 6

Green sheets were prepared according to the procedures of Examples 4 and 5 by changing the glass composition, mullite to glass mixing ratio, alumina to glass mixing ratio, mullite to alumina mixing ratio and glass mixing ratio, and multi-layer ceramic substrates were produced by laminating three or more different types of these green sheets. The thermal expansion coefficients and dielectric constants of the sintered bodies principally composed of mullite and the sintered bodies principally composed of alumina were as shown in Table 1 and Table 2 given before and those of the sintered bodies principally composed of mullite and alumina mixtures are shown in Table 3 below.

TABLE 3

| | Alumina/Mullite mixture Composition (%) | | | Glass powder Composition (%) | | | | | Sintered body Thermal expansion coefficient | Dielectric |
| --- | --- | --- | --- | --- | --- | --- | --- | --- | --- | --- |
| No. | Alumina | Mullite | (parts) | SiO$_2$ | Al$_2$O$_3$ | MgO | CaO | (parts) | ($\times 10^{-7}/°C$.) | constant |
| 1 | 50 | 50 | 70 | 55 | 30 | 9 | 6 | 30 | 56 | 7.7 |
| 2 | 70 | 30 | " | " | " | " | " | " | 61 | 8.4 |
| 3 | 30 | 70 | " | " | " | " | " | " | 50 | 7.0 |

TABLE 3-continued

| | Alumina/Mullite mixture Composition (%) | | | Glass powder Composition (%) | | | | | Sintered body Thermal expansion coefficient | Dielectric |
|---|---|---|---|---|---|---|---|---|---|---|
| No. | Alumina | Mullite | (parts) | $SiO_2$ | $Al_2O_3$ | MgO | CaO | (parts) | ($\times 10^{-7}/°C$.) | constant |
| 4 | 50 | 50 | 90 | 51 | 35 | 14 | — | 10 | 55 | 7.5 |
| 5 | 70 | 30 | " | " | " | 14 | — | " | 61 | 8.3 |
| 6 | 30 | 70 | " | " | " | 14 | — | " | 49 | 6.7 |

In case the multi-layer substrates are produced by laminating three or more different types of green sheets, the properties of the produced substrates are substantially unchanged even if a difference of up to about 10 parts is produced in weight parts of mullite, alumina and mullite/alumina mixture and in weight part of glass powder, but it is necessary that the glass composition itself be substantially fixed.

EXAMPLE 7

In Examples 1 to 6, there were shown the multi-layer substrates produced by laminating the sintered bodies principally composed of mullite, the sintered bodies principally composed of alumina and the sintered bodies principally composed of mullite/alumina mixtures. However, in case where it is required to only slightly improve the properties of the sintered bodies principally composed of alumina and the sintered bodies principally composed of mullite, it is possible to mix a slight amount of mullite in the sintered bodies principally composed of alumina and to mix a slight amount of alumina in the sintered bodies principally composed of mullite. Table 4 shows the properties of the sintered bodies principally composed of alumina and mixed with a slight amount of mullite and the sintered bodies principally composed of mullite and mixed with a slight amount of alumina.

Further, according to the present invention, the insulating layers principally composed of alumina and the insulating layers principally composed of mullite in the ceramic substrates produced in Examples 2–6 can be replaced with those shown in Table 4 in the same way as mentioned above. In either case, it is preferred to use a glass of a given composition. A proper selection of these insulating layers is needed where the electrical and mechanical properties of the substrate to be produced are specified.

As described above, the multi-layer ceramic substrates produced by using in combination the sintered bodies principally composed of mullite, the sintered bodies principally composed of alumina and the sintered bodies principally composed of a mullite and alumina mixture are even more proof against cracking at the interface of sintered bodies than the substrates produced in Examples 1–3.

According to this invention, it is possible to obtain a multi-layer ceramic substrate which combines advantages of both types of known ceramic substrates, one type using alumina as main constituent and possessing high thermal and mechanical strength and the other type using mullite as main constituent and featuring high-speed signal propagation and good matching of thermal expansion coefficient with silicon semiconductor elements, and further, such substrate can be realized

TABLE 4

| | Alumina/Mullite mixture Composition (%) | | | Glass powder Composition (%) | | | | | Sintered body Thermal expansion coefficient | Dielectric |
|---|---|---|---|---|---|---|---|---|---|---|
| No. | Alumina | Mullite | (parts) | $SiO_2$ | $Al_2O_3$ | MgO | CaO | (parts) | ($\times 10^{-7}/°C$.) | constant |
| 1 | 85 | 15 | 70 | 55 | 30 | 9 | 6 | 30 | 65 | 9.0 |
| 2 | 15 | 85 | " | " | " | " | " | " | 46 | 6.5 |
| 3 | 85 | 15 | 90 | 51 | 35 | 14 | — | 10 | 65 | 8.9 |
| 4 | 15 | 85 | " | " | " | 14 | — | " | 45 | 6.1 |

A ceramic substrate was produced under the same conditions as in Example 1 except that the insulating layer 2 in Example 1 was replaced by No. 3 in Table 4. According to this substrate, the difference in thermal expansion coefficient between the insulating layer principally composed of alumina on the surface and the insulating layers principally composed of mullite in the inside of the substrate is reduced to give a better effect for the prevention of cracking. The strength of the substrate is somewhat lowered in comparison with the substrate of Example 1 but the difference is insignificant.

A multi-layer ceramic substrate was also produced according to Example 1 by changing each insulating layer 3 with No. 4 in Table 4. It is also possible to produce a ceramic substrate by replacing the insulating layers 2 in Example 1 with No. 3 in Table 4 or by replacing the insulating layers 3 with No. 4 in Table 4.

by employing a green sheet process known in the prior art.

What is claimed is:

1. A multi-layer ceramic substrate comprising a plurality of conductor layers and insulating layers positioned between said conductor layers, said insulating layers including layers of a sintered body principally comprised of mullite, layers of a sintered body principally comprised of alumina and layers of a sintered body principally comprised of a mixture of mullite and alumina; wherein the insulating layer positioned on at least one surface of the substrate is made of a sintered body principally comprised of alumina, the insulating layer positioned between a signal line layer and a alternating ground layer where return current from the signal line flows is made of a sintered body principally comprised of mullite, and the insulating layers disposed between said layers of a sintered body principally comprised of mullite and said layers of a sintered body principally comprised of alumina are made of a sintered body principally comprised of a mixture of mullite and alumina.

2. A multi-layer ceramic substrate according to claim 1, wherein said sintered body principally comprised of a mixture of mullite and alumina contains mullite and alumina in the same amounts.

3. A multi-layer ceramic substrate according to claim 1, wherein the layers of said sintered body principally comprised of a mixture of mullite and alumina comprise at least two mutually adjoining layers with a conductor layer interposed therebetween, and the layer adjoining to said layer principally comprised of mullite contains a greater amount of mullite than that of alumina and the layer adjoining to said layer principally comprised of alumina contains a greater amount of alumina than that of mullite so that the thermal expansion coefficient of said layers will differ stepwise.

4. A method of producing a multi-layer ceramic substrate, which comprises the steps of preparing first green sheets each being principally comprised of mullite and each having a conductor layer formed on its surface, second green sheets each being principally comprised of alumina and each having a conductor layer formed on its surface and third green sheets each being principally comprised of a mixture of mullite and alumina and each having a conductor layer formed on its surface, and laminating said first, second and third green sheets and sintering the laminate; during said laminating step, said green sheets being laminated so that at least one of said second green sheets will be positioned on at least one surface of a substrate and at least one of said third green sheets will be positioned between at least one of said first green sheets and at least one of said second green sheets.

5. The method according to claim 4, wherein said first green sheets are principally comprised of mullite and also contain alumina in a small proportion.

6. The method according to claim 5, wherein said second green sheets are principally comprised of alumina and also contain mullite in a small proportion.

* * * * *